(12) United States Patent
McDonnell

(10) Patent No.: US 11,579,218 B2
(45) Date of Patent: Feb. 14, 2023

(54) METHOD AND SYSTEM FOR IDENTIFYING THE LOCATION OF AN OBSTRUCTION IN A PIPELINE

(71) Applicant: PureHM Inc., Nisku (CA)

(72) Inventor: Shamus McDonnell, Nisku (CA)

(73) Assignee: PUREHM INC., Calgary (CA)

( * ) Notice: Subject to any disclaimer, the term of this patent is extended or adjusted under 35 U.S.C. 154(b) by 340 days.

(21) Appl. No.: 16/852,155

(22) Filed: Apr. 17, 2020

(65) Prior Publication Data
US 2021/0325488 A1 Oct. 21, 2021

(51) Int. Cl.
| | | |
|---|---|---|
| G01R 33/18 | (2006.01) | |
| G01V 3/08 | (2006.01) | |
| G01R 33/02 | (2006.01) | |
| G01S 19/01 | (2010.01) | |

(52) U.S. Cl.
CPC ......... *G01R 33/18* (2013.01); *G01R 33/0206* (2013.01); *G01S 19/01* (2013.01); *G01V 3/08* (2013.01)

(58) Field of Classification Search
CPC .... G01R 33/18; G01R 33/0206; G01R 33/10; G01R 33/12; G01S 19/01; G01V 3/08; G01V 3/081
USPC ........................................................ 324/209
See application file for complete search history.

(56) References Cited

U.S. PATENT DOCUMENTS

| | | | | |
|---|---|---|---|---|
| 3,038,604 A | * | 6/1962 | Muller | B07C 5/14 |
| | | | | 209/555 |
| 6,393,212 B1 | * | 5/2002 | Hutchinson | F04B 19/027 |
| | | | | 392/491 |
| 7,211,048 B1 | * | 5/2007 | Najafi | A61B 5/0215 |
| | | | | 600/483 |
| 2008/0053242 A1 | * | 3/2008 | Schumacher | G01F 1/58 |
| | | | | 73/861.42 |

(Continued)

FOREIGN PATENT DOCUMENTS

| | | | | |
|---|---|---|---|---|
| CA | 2866162 A1 | 9/2013 | | |
| WO | WO-2011020059 A1 | * | 2/2011 | ............. G01R 33/04 |

OTHER PUBLICATIONS

Bao, Sheng, et al. "Evolution of magnetic hysteresis due to asymmetric cyclic loading in X80 pipeline steel." Insight-Non-Destructive Testing and Condition Monitoring 61.9 (2019): 507-514. (Year: 2019).*

(Continued)

*Primary Examiner* — Christopher P McAndrew
(74) *Attorney, Agent, or Firm* — Barnes & Thornburg LLP

(57) ABSTRACT

There is provided a method and system for identifying the location of an obstruction in a pipeline comprising: sensing the magnetic field generated by a pipeline at an initial pressure from a first location along the length of the pipeline to obtain a baseline reading; altering the pressure from a first end until a maximum pressure or minimum pressure is attained; sensing the magnetic field at the maximum or minimum pressure from the first location to obtain a stress (Continued)

reading; and identifying the location of the obstruction as a) being between a second end and the first location when there is a deviation between the stress reading and the baseline reading at the first location or as b) being between the first end and the first location when there is an absence of a deviation between the stress reading and the baseline reading at the first location.

22 Claims, 3 Drawing Sheets

(56) References Cited

U.S. PATENT DOCUMENTS

2008/0060710 A1* 3/2008 Carlson .................. F16K 13/10
137/807
2012/0326710 A1 12/2012 Rouve et al.

OTHER PUBLICATIONS

Rogers, L. M. "Pipeline blockage location by strain measurement using an ROV." Offshore Technology Conference. OnePetro, 1995. (Year: 1995).*

International Search Report & Written Opinion; PCT/CA2020/050519; dated Jan. 4, 2021.

Overview of Magnetostrictive Sensor Technology; Journal of Intelligent Material Systems and Structures, Fredrick T. Calkins et al., vol. 18—Oct. 2007, vol. 18, pp. 1057-1066.

* cited by examiner

METHOD AND SYSTEM FOR IDENTIFYING THE LOCATION OF AN OBSTRUCTION IN A PIPELINE

TECHNICAL FIELD

The present invention relates to methods for identifying the location an obstruction in a pipeline.

BACKGROUND

Pipelines are comprised of ferromagnetic materials, such as iron, nickel, steel and other materials. Large Standoff Magnetometry (LSM) technology is known be used to identify and locate elevated levels of stress through the measurement of the magnetic field surrounding steel pipelines. LSM detects inverse magnetostriction (also known as the Villari effect) which is the change of the magnetic susceptibility of a material when subjected to mechanical stress. LSM technology has been used to detect defects as they appear as changes in the magnetic field around the pipeline which can indicate the presence of stress on the pipe wall (e.g. due to dents, buckles, cracks, and corrosion metal loss. Thus, LSM can identify stress concentration by performing an indirect inspection.

When a pipeline flow is severely restricted or blocked due to stuck pigs (pipeline inspection gauge), or product build up, the location must be identified to facilitate remedial action. When a blockage cannot be located by conventional means, then the pipe is exposed, tapped and a pressure gauge is used to verify if that location is before or after the blockage by comparison/identification of the pressure increase. This process requires large excavation and a process called hot tapping when the pipe is full of petroleum product. Each excavation and hot tap can cost tens of thousands of dollars, and as many as a dozen or more may be required to adequately pin-point the location of the blockage.

There is a need to identify the location of an obstruction in the pipeline without requiring repeated pipeline excavation, exposure, and tapping, in order to pin-point the location of the blockage.

SUMMARY OF THE INVENTION

It is an embodiment of the present invention to provide a method and system that uses the change in the magnetic field due to pressure-induced stress in the pipe wall to pinpoint the location of stuck pigs and/or obstructions in a section of pipe.

It is an embodiment of the present invention to provide a method and system that uses the change in the magnetic field due to induced stress in the pipe wall when the internal pressure applies stress to the pipe wall. This stress in the pipe wall due to pressure applied can be measured directly as a magnetic amplitude to determine if the pipe is under pressure and producing stress in the pipe wall, and confirmed by cycling the pressure up and down to observe corresponding increases and decreases in the magnetic field strength for confirmation. In some embodiments, the method and system is repeatedly performed along the length of the pipeline in order to detect the location of stuck pigs and/or obstructions in a section of pipe.

It is an embodiment of the present invention to provide a method and system that uses the change in the magnetic field due to induced stress in the pipe wall when the internal pressure applies stress to the pipe wall. The measurement is made at a first location along the pipeline suspected of having an obstruction. The corresponding change in the magnetic field during the pressure change is indication that the first location is between the pressure source and the obstruction, while no observation of a corresponding change in the magnetic field during the pressure is indication that the obstruction is between the pressure source and the first location.

In the first case, where the magnetic change corresponding to the pressure change was observed at the first location, the magnetic sensor would be positioned at a second location further from the pressure source and the pressure altered again as it was at the first location to again test for magnetic change corresponding to the pressure change.

In the second case, where no magnetic change corresponding to the pressure change was observed at the first location, the magnetic sensor would be positioned at a second location closer to the pressure source and the pressure altered again as it was at the first location to again test for magnetic change.

It is an embodiment of the present invention to provide a method for identifying the location of an obstruction in a pipeline, the method comprising: positioning a magnetometer along the pipeline at the first location, generating at least one data point at an initial pressure from the sensed magnetic field, then altering the pressure from the first end of the pipeline until a maximum pressure or minimum pressure is attained; generating at least one data point from the sensed magnetic field at the maximum or minimum pressure, then returning the pressure to the initial pressure and recording another data point of the sensed magnetic field before altering the pressure from a second end of the pipeline until a maximum pressure or minimum pressure is attained; generating at least one data point from the sensed magnetic field at the maximum or minimum pressure from the second end of the pipeline, then returning the pressure to the initial pressure and recording another data point of the sensed magnetic field.

The observation of a corresponding change in the magnetic field during the pressure change at the first end of the pipeline is indication that the first location is between the first end of the pipeline and the obstruction, while no observation of a corresponding change in the magnetic field during the pressure is indication that the obstruction is between the first end and the first location.

The observation of a corresponding change in the magnetic field during the pressure change at the second end of the pipeline is indication that the first location is between the second end of the pipeline and the obstruction, while no observation of a corresponding change in the magnetic field during the pressure is indication that the obstruction is between the second end and the first location.

The observation of no corresponding change in the magnetic field during pressure changes from either the first end or the second end is an indication that the obstruction is at the first location, or that there are obstructions between the first location and both the first end and second end of the pipeline.

It is an embodiment of the present invention to provide a method for identifying the location of an obstruction in a pipeline, the method comprising sensing the magnetic field generated by the pipeline from a first location and a second location along a length of the pipeline to generate a baseline reading at an initial pressure; altering the pressure from a first end of the pipeline until a maximum pressure or minimum pressure is attained; generating at least one data point from the sensed magnetic field at the maximum or minimum pressure at the first location and at the second location; and identifying the location of the obstruction as being between the first location and the second location when a deviation from the baseline reading is observed at the first location during the maximum or minimum pressure and when there is an absence of deviation from the baseline reading at the second location during the maximum or minimum pressure.

It is an embodiment of the present invention to provide a system for identifying the location of an obstruction in a pipeline, the system comprising: one or more magnetometers, the one or more magnetometers are configured to sense the magnetic field generated by the pipeline before, during, and after cycling of pipeline pressure between an initial pressure and maximum or minimum pressure when positioned at a first location and at a second location downstream of the first location; a processor; and a non-transitory computer readable media having instructions stored thereon which when executed cause the processor to: generate at least one data point from the sensed magnetic field before, during, and after cycling of pipeline pressure between an initial pressure and maximum or minimum pressure; and identify the location of the obstruction as being between the first location and the second location when a deviation from the baseline reading is observed at the first location during the maximum or minimum pressure and when there is an absence of deviation from the baseline reading at the second location during the maximum or minimum pressure.

It is an embodiment of the present invention to provide a method and system for identifying the location of an obstruction in a pipeline comprising: positioning a magnetometer over and along the pipeline at a first location, recording the magnetic field as measured on the magnetometer, altering the pressure of the pipe, determining the time it takes before there is a change in the magnetic field as measured on the magnetometer at the first location, moving to another location and positioning the magnetometer over and along the pipeline at the another location, recording the magnetic field as measured on the magnetometer, altering the pressure of the pipe, determining the time it takes before there is a change in the magnetic field as measured on the magnetometer at the another location, wherein the longer the time to increase or decrease the pressure indicates the distance to obstruction.

It is an embodiment of the present invention to provide a method for identifying the location of an obstruction in a pipeline, the method comprising: positioning a magnetometer at a first location along the pipeline to sense the magnetic field and to generate a baseline reading at an initial pressure; altering the pressure from a first end of the pipeline until a maximum pressure or minimum pressure is attained; generating at least one data point from the sensed magnetic field at the maximum or minimum pressure; returning to the initial pressure; repositioning the magnetometer at a second location above the pipeline and downstream from the first location to sense the magnetic field and to generate a baseline at the initial pressure; altering the pressure from the first end of the pipeline until a maximum pressure or minimum pressure of the pipeline is attained; generating at least one data point from the sensed magnetic field at the maximum or minimum pressure; returning to the initial pressure; and identifying the location of the obstruction as being between the first location and the downstream location when a deviation from the baseline reading is observed at the first location during the maximum or minimum pressure and when there is an absence of deviation from the baseline reading at the downstream location during the maximum or minimum pressure.

According to an aspect, the method further comprises repositioning the magnetometer at a third location along the pipeline between the first location and the second location; altering the pressure from the first end of the pipeline until the maximum pressure or minimum pressure is attained; recording at least one data point at the maximum or minimum pressure; returning to the initial pressure; and identifying the location of the obstruction as being between the third location and the second location when a deviation from the baseline reading is observed at the third location during the maximum or minimum pressure or identifying the location of the obstruction as being between the first location and the second location when there is an absence of deviation from the baseline reading at the third location during the maximum or minimum pressure.

It is an embodiment of the present invention to provide a method for identifying the location of an obstruction in pipeline, the method comprising: positioning a magnetometer above a pipeline at an initial pressure; recording a stationary data point after establishing a baseline and recording the pipeline pressure when the stationary data point is recorded; altering the pressure in the pipeline from one end of the pipeline towards the other end and recording a second stationary data point at the time when the pressure is altered and recording the pipeline pressure when the secondary stationary data point is recorded; recording a third stationary data point when the maximum pressure or minimum pressure of the pipeline is attained and recording the pipeline pressure when the third stationary data point is recorded; maintaining the maximum or minimum pressure and recording at least one data point at the maximum or minimum pressure; returning the pressure in the pipeline to the initial pressure and recording a fourth stationary data point and recording the pipeline pressure when the fourth stationary data point is recorded.

It is an embodiment of the present invention to provide a method for identifying the location of an obstruction in a pipeline comprising: positioning a magnetometer over and along the pipeline at a first location, recording the magnetic field as measured on the magnetometer, altering the pressure of the pipe, determining the time it takes before there is a change in the magnetic field as measured on the magnetometer at the first location, moving to another location and positioning the magnetometer over and along the pipeline at the another location, recording the magnetic field as measured on the magnetometer, altering the pressure of the pipe, determining the time it takes before there is a change in the magnetic field as measured on the magnetometer at the another location, wherein the longer the time to increase or decrease the pressure indicates the distance to obstruction.

It is an embodiment of the present invention to provide a method for identifying the location of an obstruction in a pipeline, the method comprising: sensing the magnetic field generated by a pipeline at an initial pressure from a first location along the length of the pipeline to obtain a baseline reading; altering the pressure from a first end of the pipeline until a maximum pressure or minimum pressure is attained; sensing the magnetic field at the maximum or minimum pressure from the first location to obtain a stress reading; and identifying the location of the obstruction as a) being between a second end of the pipeline and the first location when there is a deviation between the stress reading and the baseline reading at the first location or as b) being between the first end of the pipeline and the first location when there is an absence of a deviation between the stress reading and the baseline reading at the first location.

According to an aspect, wherein when the location of the obstruction is identified: i) as being between the first location and the second end of the pipeline, further comprising: sensing the magnetic field generated by the pipeline at an initial pressure from a second location further from the first end of the pipeline than the first location to generate a baseline reading at an initial pressure at the second location; altering the pressure from the first end of the pipeline until a maximum pressure or minimum pressure is attained; sensing the magnetic field at the maximum or minimum pressure at the second location to generate a stress reading; identifying the location of the obstruction as a) being between the first location and the second location when there is an absence of deviation between the stress reading and the baseline reading at the second location or as b) being further from the first end of the pipeline than the second location when there is a deviation between the stress reading and the baseline reading at the second location; or ii) as being between the first end of the pipeline and the first location, further comprising: sensing the magnetic field generated by the pipeline at an initial pressure from a third location closer to the first end than the first location along the length of the pipeline to obtain a baseline reading; altering the pressure from the first end of the pipeline until a maximum pressure or minimum pressure is attained; sensing the magnetic field at the maximum or minimum pressure from the third location to generate a stress reading; and identifying the location of the obstruction as a) being between the third location and the first location when there is a deviation between the stress reading and the baseline reading at the third location or as b) being between the first end of the pipeline and the third location when there is an absence of a deviation between the stress reading and the baseline reading at the second location.

According to an aspect, wherein the sensing comprises producing at least one data point representative of the sensed magnetic field at the initial pressure and at the maximum or minimum pressure and/or visualizing an output representative of the sensed magnetic field at the initial pressure and at the maximum and minimum pressures on a display.

According to an aspect, wherein the at least one data point produced is stored locally for retrieval or is transmitted to a remote location.

According to an aspect, wherein when there is the absence of a deviation between the stress reading and the baseline reading at the first location, further comprising: altering the pressure from the second end of the pipeline opposite the first end until a maximum pressure or minimum pressure is attained; and identifying the location of the obstruction as being i) between the first end of the pipeline and the first location when there is a deviation between the stress reading and the baseline reading at the first location only when pressure is changed from the first end of the pipeline; ii) between the second end of the pipeline and the first location when there is a deviation between the stress reading and the baseline reading at the first location only when pressure is changed from the second end of the pipeline; or iii) at the first location when there is an absence of deviation between the stress reading and the baseline reading at the first location when the pressure is changed from either the first end or the second end of the pipeline.

According to an aspect, the maximum pressure is greater than 0 psi, is greater than maximum design pressure, is greater than about 10% of maximum design pressure, or is greater than about 30% of maximum design pressure.

According to an aspect, the maximum design pressure is the $P_{Barlow}$ pressure.

According to an aspect, the minimum pressure is less than or equal to 0 psi.

According to an aspect, the pipeline is buried under cover and/or the obstruction is a stuck pig.

According to an aspect, further comprising obtaining a GPS location from at least one or more of the locations.

According to an aspect, there are a plurality of magnetometers are located along the length of the pipeline.

It is an embodiment of the present invention to provide a system for identifying the location of an obstruction in a pipeline, the system comprising: one or more magnetometers configured to sense the magnetic field generated by the pipeline before and during a cycling of pipeline pressure from a first end of the pipeline between an initial pressure and a maximum or minimum pressure when one of the one or more magnetometers is positioned at a first location; a processor; and a non-transitory computer readable media having instructions stored thereon which when executed cause the processor to: obtain a baseline reading of the sensed magnetic field at the initial pressure and a stress reading of the sensed magnetic field at the maximum or minimum pressure; and identify the location of the obstruction as a) being between a second end of the pipeline and the first location when there is a deviation between the stress reading and the baseline reading at the first location or as b) being between the first end of the pipeline and the first location when there is an absence of a deviation between the stress reading and the baseline reading at the first location.

According to an aspect, when the location of the obstruction is identified: i) as being between the second end of the pipeline and the first location, further comprising a second location further from the first end of the pipeline than the first location to sense the magnetic field generated by the pipeline before and during a cycling of pipeline pressure from the first end of the pipeline between an initial pressure and a maximum or minimum pressure when the one or more magnetometers is positioned at the second location; and instructions when executed to cause the processor to identify the location of the obstruction as a) being between the first location and the second location when there is an absence of deviation between the stress reading and the baseline reading at the second location or as b) being further from the first end of the pipeline than second location when there is a deviation between the stress reading and the baseline reading at the second location; or ii) as being between the first end of the pipeline and the first location, further comprising a third location upstream from the first location to sense the magnetic field generated by the pipeline before and during a cycling of pipeline pressure from the first end of the pipeline between an initial pressure and a maximum or minimum pressure when the one or more magnetometers is positioned at the third location; and instructions when executed to cause the processor to identify the location of the obstruction as a) being between the third location closer to the first end than the first location when there is a deviation between the stress reading and the baseline reading at the third location or as b) being between the first end of the pipeline and the third location when there is an absence of a deviation between the stress reading and the baseline reading at the third location.

According to an aspect, the instructions when executed produce at least one data point representative of the sensed magnetic field at the initial pressure and at the maximum or minimum pressure and/or produce a visual output representative of the sensed magnetic field at the initial pressure and at the maximum and minimum pressures on a display.

It is an embodiment of the present invention to provide a method for identifying the location of an obstruction in a pipeline comprising: altering the pressure of a pipeline and holding at the maximum pressure; moving a magnetometer over a segment of the pipeline in a first pass; recording the magnetic field measured on the magnetometer as the magnetometer is traversed over the length of the pipeline where the blockage is suspected; reducing the pressure and moving over the segment in a second pass; recording the magnetic field measured on the magnetometer; comparing the change of magnetic field strength at each location between the two passes; and identifying the location of an obstruction as being the location when a pressure change was or was not observed when there was a change/decrease in the magnetic field between the two passes.

In an aspect, the comparing is done by post processing the recording or in real-time while recording the second pass.

A method for identifying the location of an obstruction in a pipeline comprising: positioning a magnetometer adjacent to (near to) pipeline at a location; recording the magnetic field as measured on the magnetometer; altering the pressure of the pipeline from a first end of the pipeline; determining the length of time it takes before there is a change in the magnetic field as measured on the magnetometer as result of the change in pressure; moving to another location and positioning the magnetometer over the pipeline at the another location; recording the magnetic field as measured on the magnetometer; altering the pressure of the pipe of the pipeline from the first end; determining the length of time it takes before there is a change in the magnetic field as measured on the magnetometer at the another location as result of the change in pressure; and identifying the distance from an obstruction from the determined length of times, wherein the longer the time required to increase or decrease the pressure indicates a further distance from the obstruction.

DETAILED DESCRIPTION

Figure 1A:
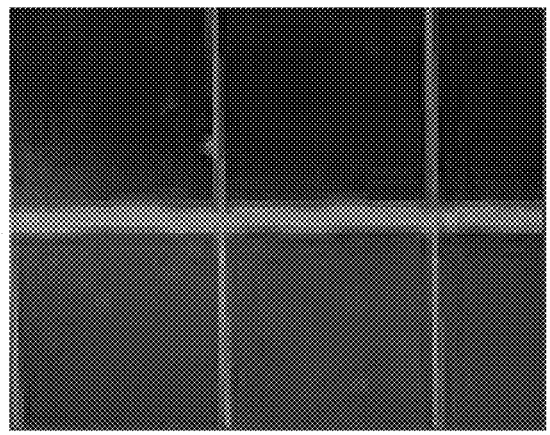
FIG. 1a is a magnetometer sensor reading of a pipeline maintained under 0 kPa.

Reference will be made below in detail to exemplary embodiments of the invention, examples of which are illustrated in the accompanying drawings. Wherever possible, the same reference numerals used throughout the drawings refer to the same or like parts.

In one embodiment, there is provided the use of magnetometer (e.g. Spectrum XLI PWA comprising an AMR magnetometer) to determine the location of a stuck pig or other blockage that is plugging a buried pipeline. The chosen magnetometers should have sufficient sensitivity to measure the magnetic field that forms around the buried pipelines which are subjected to stress from pressure inside the pipe. Additional types of magnetic sensors include, but are not limited to, cesium vapor magnetometers Hall effect sensor, magneto-diode, magneto-transistor, GMR magnetometer, magnetic tunnel junction magnetometer, magneto-optical sensor, Lorentz force based MEMS sensor, Electron Tunneling based MEMS sensor, MEMS compass, Nuclear precession magnetic field sensor, optically pumped magnetic field sensor, fluxgate magnetometer, search coil magnetic field sensor and SQUID magnetometer.

Generally, in LSM, a magnetic field is sampled using a magnetometer, recording data hundreds of times per second. The recorded data is analyzed to identify indications with signal characteristics similar to a dipole (stress concentration) to identify a change in the magnetic field, signal quality, location of interest, repeatability and relative size of the indication. The dipole signature represents an area of possible stress concentration. These possible stress concentration areas are recommended for further investigation using high definition tools and/or correlation using other data sets available to assist in making a sound integrity decision.

Figure 1B:
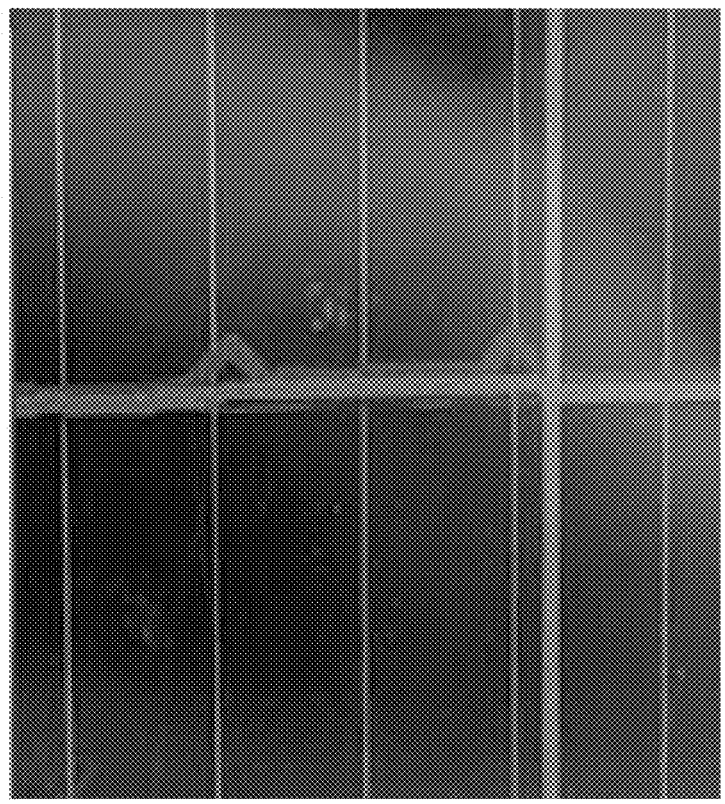
FIG. 1b is a magnetometer sensor reading of the pipeline of FIG. 1a under maximum pressure of 9200 kPa.

In one embodiment, there is provided a method that uses magnetometers to observe real time cycles of pressure in the pipeline. In one aspect, method uses magnetometers as a non-intrusive pressure gauge. FIGS. 1a and b shows magnetometer sensor readings of a section of a pipeline over time. In particular, FIG. 1a shows the sensor readings the pipeline that is maintained under 0 kPa. As shown in FIG. 1b the application of pressure to 9200 kPa is represented by the deflection of the sensor readings. The deflection of the sensor readings correlate directly with instances when the pipeline pressure is increased to 9200 kPa.

In one embodiment, the present disclosure relates to a method and system used to detect the change in the magnetic field due to stress induced in the pipe wall when it is pressured. In some aspects, the pressure of the pipeline is increased to a threshold sufficient to create a measurable change in the stress and corresponding magnetic field strength of the pipeline.

In some aspects, the pipe is pressurized up to a percentage of the maximum design pressure (as calculated by Barlow's formula). The maximum pressure that the pipe can hold is determined by Barlow's formula:

$$P_{Barlow} = 2St/D$$

where:
$P_{Barlow}$=pressure, psig
S=Specified Minimum Yield Strength in psi
t=nominal wall thickness, in inches
D=outside Diameter in inches From the above, $P_{Barlow}$ is the maximum design pressure which is dependent on the types of materials the pipeline is made from.

The test pressure ($P_{test}$) is calculated by subtracting $P_{min}$ from $P_{max}$ and then dividing the result by $P_{Barlow}$.

$$P_{test} = (P_{max} - P_{min})/P_{Barlow}$$

$P_{max}$ is maximum pressure of the pipeline and takes into consideration fittings. $P_{min}$ is the minimum pressure experienced by the pipeline carrying liquid and takes into consideration changes in pressure cause by changes in the elevation of the pipeline.

Therefore, in each case, the amount of pressure needed to create a measurable change in the stress and corresponding magnetic field strength would be determined, in each case, by the: pipe diameter, wall thickness, and/or SMYS of the steel.

In some aspects, the pressure of the pipeline is increased ~10% in order to create a measurable change in the stress and corresponding magnetic field strength.

In other aspects, the pressure of the pipeline is cycled up and down by ~30% of maximum design pressure to create a measurable change in the stress and corresponding magnetic field strength.

The sensitivity of individual sensors and their distance is from the pipe wall will also play a factor, and the combined sensor, distance, and % of $P_{max}$ could be used to confirm that magnetic response could be seen at any given pipeline location. Thus, in one aspect, the more sensitive magnetometers are, the more these magnetometers would be able to see smaller pressure/stress changes.

The method and system does not need to be calibrated to show the actual pressure, since the method can provide a yes/no for presence of the pressure change at a test location(s), as observed as an increase and decrease in magnetic field that corresponds in time to the pressure cycling applied to the pipe.

In some embodiments, the disclosed method and system identifies the location of stuck pigs, or blockages that prevent flow through a metallic or metal reinforced pipeline. The disclosed method and system relates to any oil or gas gathering fields, any transmission pipeline, or distribution piping system, including water, waste water, beer or other product pipeline.

The disclosed method and system can detect the change in magnetic field that results from pipe being pressurized and utilize this information to identify the location of the stuck pig or blockage.

In one embodiment, the pressure of the pipe is cycled from maximum pressure to zero pressure, or as high and low as possible to create a minimum of about 10% or equal to or greater than 30% change in the stress level on the pipe. According to one embodiment, to detect pressure changes in the pipe, $P_{test}$ should exceed 10% of $P_{Barlow}$ or exceed 30% of $P_{Barlow}$. The pipeline diameter, location and material factors listed above will affect sensitivity and maximum standoff from pipe for detection of pressure changes.

In one embodiment, the initial pressure could be at an elevated pressure, and therefore a higher stress state as measured by the magnetic field sensor. The pressure would then altered by lowering the pressure, such as by using vacuum source connected to the pipeline, to the minimum pressure. In some aspects, the minimum pressure is less than 0 psi.

The magnetometers sense a magnetic field generated by the ferromagnetic material in order to generate magnetic field data. In some embodiments, the magnetometer can be moved from one location to another location along the pipeline. In other embodiments, there may be plurality of magnetometers located at intervals along the pipeline and each one of the plurality of magnetometers held fixed in location, relative to the pipeline, to sense the magnetic field in order to generate magnetic field data.

Each magnetometer may include three orthogonally oriented magnetometers. Each data point of the map may represent strength of the sensed magnetic field in each of three orthogonal directions (X-axis, Y-axis, and Z-axis).

In one embodiment, there is provided a method for identifying the location of an obstruction in a pipeline. A technician is dispatched to the pipeline and positions a magnetometer at a first location above the pipeline to sense the magnetic field. In some embodiments, the magnetometers are positioned on the ground and above the pipeline buried under cover. In some aspects, where possible, the magnetometer could be positioned sensor directly on the pipe, or as near as possible to the pipeline to minimize the occurrence of false positives. The precise positioning of the sensor may be determined by factors such as sensitivity of the sensor and strength of the magnetic field generated by the pipe under stress from internal pressure upstream of the blockage. A weaker sensor or weaker magnetic field due to lower stress levels on the pipe may require positioning the sensor in closer proximity to the pipe.

In this embodiment, the technician remains at the first location for a period sufficient to establish a baseline reading at an initial pressure of the pipeline. Establishing the baseline minimizes any interference or drifting of the zeroed levels. When a stable baseline has been confirmed, the pressure of the pipeline observed. Optionally, when a stable baseline has been confirmed, a stationary data point is recorded, and the pressure of the pipeline observed. In an alternative embodiment, the technician can observe the changes in the magnetic field response on the display of the magnetometer and no data is recorded.

The pressure of the pipeline is then altered from the launch end of the pipeline until a maximum pressure or minimum pressure is attained. At least one data point is generated from the sensed magnetic field at the maximum or minimum pressure. In some embodiments, the generated data point(s) are recorded. In an alternative embodiment, the technician can observe the changes in the magnetic field response on the display of the magnetometer and there is no recording of the data point. After a period at the maximum or minimum pressure, the pressure in the pipeline is returned to the initial pressure. The length of the period can be, for example, about 3 to 5 minutes. The length of the period may depend on the pipeline pump or compressors used to induce changes in the stress level of the pipeline. In some aspects, the observation of a pressure cycle could performed in less than one minute.

The pressure cycle can be altered from minimum to maximum, or maximum to minimum and to verify when pressure has reached those points, magnetometer can register the corresponding change at the time of the pressure changing.

The magnitude and direction of the change of the sensed magnetic field is dependent on numerous factors, including the diameter, wall thickness, grade of steel, and current level of magnetism on the pipe.

The changes in magnetic response correlates to the pressure cycling and not from momentary magnetic fluctuations due to some other magnetic phenomena or disturbance occurs in the vicinity; in, on, or around the pipe, such as but not limited to telluric currents from solar flares, moving machinery, and electric current surges.

The magnetometer is then repositioned to a second location above the pipeline and downstream from the first location to sense the magnetic field and to establish a baseline at the initial pressure. The pressure of the pipeline is again altered from the launch end of the pipeline until a maximum pressure or minimum pressure is attained and at least one data point is generated from the sensed magnetic field at the maximum or minimum pressure. The at least one data point that is generated from the sensed magnetic field at the maximum (increased) or minimum (decreased) pressure, relative to the initial pressure, is understood to be a stress reading.

After about a period of, for example, 3 to 5 minutes at the maximum or minimum pressure, the pressure in the pipeline is returned to the initial pressure.

The location of the obstruction is identified as being between the first location and the downstream location (the second location) when a deviation from the baseline reading is observed at the first location during the maximum or minimum pressure and when there is an absence of deviation from the baseline reading at the downstream location (the second location).

In some embodiments, is may be possible to obtain further information of the location of the obstruction, the technician can be directed to reposition the magnetometer at another location near the ground and above the pipeline between the first location and the second location. The pressure of the pipeline is again altered from the launch end of the pipeline until a maximum pressure or minimum pressure is attained and at least one data point is generated from the sensed magnetic field at the maximum or minimum pressure. After a period of, for example, about 3 to 5 minutes at the maximum or minimum pressure, the pressure in the pipeline is returned to the initial pressure.

The location of the obstruction can then be determined as being between the another location and the second location when a deviation from the baseline reading is observed at the another location during the maximum or minimum pressure or identifying the location of the obstruction as being between the first location and the another location when there is an absence of deviation from the baseline reading at the another location during the maximum or minimum pressure.

In an alternative embodiment, there is provided a method for identifying the location of an obstruction in a pipeline buried under cover, wherein the technician:

a) places the magnetometer on subject pipe near pressure source to verify strength of magnetic field due to cycle from maximum to minimum pressure (or maximum to minimum). The technician will be able to confirm the maximum offset distance that magnetometer can be from the pipe to detect magnetic changes caused by the pressure cycles.

b) the technician moves sensor to the mid-point of the length of pipe where the blockage is suspected (50% of the distance), and then places the sensor over pipeline within the maximum offset distance previously established in step a), and pressure is cycled again.

c) if a magnetic response due to pressure was observed in step b), the technician moves to 75% of the distance and repeats the pressure cycling. If no magnetic response due to pressure cycling was observed at the 75% of the distance, then the technician moves to a distance about half way between the first location at about the 50% length and the second location at about the 75% length of the distance and repeats the pressure cycling.

d) repeat step c), halving the remaining distance where pressure is observed as a magnetic response until the blockage is narrowed down to desired length (length/location where no pressure response is observed).

In summary, the location of the obstruction could be pinpointed after establishing an ideal distance from an end which pressure is altered (e.g. launch end) and the selecting test locations for sensing the magnetic field based on halving the segment each time. For example, a first test would be at ½ distance between the ends of the pipeline; a second test would be at either ¼ or ¾ distance, a third test would be down to ⅛ intervals; and a fourth test would be at ¹⁄₁₆ intervals. Additional tests comprising pressure cycling and sensing would be added until the location is pinpointed.

The location of the technician and the various locations of the magnetometer along the pipeline can be confirm using typical GPS coordinates.

The method can be repeated if necessary to confirm maximum offset (which is the distance that the sensor can see the magnetic change due to pressure) and if surface assessment on buried pipe can be utilized. The maximum distance that the sensor can see the magnetic change due to pressure may be dependent on, but not limited to:

1) the diameter of pipe where the larger diameter has more square inches of surface area, and therefore there would be expected to be more stress due to each pound per square inch of pressure.

2) the thickness and grade of steel that the pipe is made from—whereas thicker and tougher steel will experience less stress due to the same pounds per square inch;

3) the sensitivity of the magnetometer—if the magnetometer is more sensitive, the magnetometer can respond to the pressure change from further away, or respond to small pressure changes, with corresponding less stress on the pipe, and therefore also less magnetic field change.

Without being limited to any particular theory, it would follow that a larger diameter pipe, made form thinner steel, under higher pressure will create much larger magnetic field responses that can be measured from a further distance away. Accordingly, the distance can be determined taking into consideration the above factors.

According to some embodiments, it is preferable to rely on above-ground testing at the standoff distance from the pipeline being tested.

In some other embodiments, it may be preferable to access to the pipeline. In some aspects, this can be done through a typical hydrovac hole of about 12" in diameter so as to avoid having to excavate and expose a large enough length of pipe to install a hot tap for use of a conventional pressure gauge. In these situations, it is preferable to place a water-proof protective non-magnetic case, and tethered with a rope for secure retrieval. A non-metallic pipe, large enough to allow passage of the magnetometers, may also need to be inserted into the hydrovac hole to protect the sensor from cave-ins and sloughing that could otherwise bury the sensor, and disrupt testing. Other factors that disrupt testing include ground water seeping into holes below the water table may cause sensor movement/floating. It may be desirous to avoid situations that results in movement of the sensor because if the sensor moves in the magnetic field surrounding the pipe it will register different magnetic strength and orientation . . . this change may be misinterpreted as the pressure cycle if it occurred at the same time. It may also cause the sensor to move to a greater distance than the maximum for detecting the magnetic change. The magnetic field change due to movement may also be greater than that from the pressure in the pipe, in which case the signal to noise ratio is too great to see the pressure change (e.g. if the desired signal is for instance a +2 but the movement caused a +50 change, then it may not be possible to see the pressure effect).

Most transmission pipelines are piggable; and most flow in one default direction, sometimes flow is even restricted to one direction with check valves. The end with the facility for sending pigs into the pipeline is called the launch end, and specifically it is the end for launching pigs. For reference, this is would also be called the "upstream" direction, meaning the start point, or in a direction meaning against pipeline flow. The other end is then the downstream end, where the "trap" for receiving pigs is located, and as a direction means in the direction of flow.

As described in the method above, the pressure of the pipeline is increased from one end of the pipeline. In an example embodiment, this is the upstream/launch end. However, it would be understood that the pressure of the pipeline can be increased from downstream/trap end of the pipeline. In pipelines that do not have check valves that would otherwise prevent reverse flow, the method can optionally be repeated with pressure applied from the direction opposite the launch end. In this aspect, if no magnetic response at one test location is observed from cycling the pressure at the launch/upstream end of the pipeline, then it would conclude that the test location is downstream of the blockage (i.e. the blockage is between this location and the launch end). By then applying pressure from the opposite end of the pipe (the trap/receive/downstream end), one would confirm that pressure is observable and that the magnetometer is working, and that the blockage is in fact between this test location and the launch. If the test location happens to be over or substantially around the blockage and/or the blockage spans several meters long such that no pressure will reach several meters of pipe, then no magnetic response will be observed from either end (i.e. pressure is raised from either end of the pipeline) when the sensor is near the pipe.

As well, the method steps can be repeated if any movement of the sensor pod, or unexplained changes in the sensor values are observed.

In some embodiments, the technician is dispatched to the half way point of the segment being evaluated. If a conclusive test confirms the direction the obstruction, the technician is directed to move to half of that segment, and then repeat the method. The movement of technician can continue in this fashion until the pig and/or obstruction is located within a reasonably short distance for the technician to excavate, hot tap, or cut out.

In some other embodiments, there is provided a method and system for identifying the location of an obstruction in a pipeline comprising a plurality of magnetometers placed in intervals along the pipeline. The method comprising performing pressure cycling and observing which magnetometers detected a change in the magnetic response. Magnetometers that detect the change are upstream of the blockage, whereas those that do not detect any change are in close proximity to the location of the obstruction, over the location of the obstruction, or are downstream of the location of the obstruction. In some aspects, the plurality of magnetometers are positioned in numbers and/or have sufficient sensitivity to enable detection along the entire length of the pipeline. In some aspects the interval can be at about 100 m intervals. In further aspects, the system further comprises magnetometers with recording devices and/or can display changes in the signal responses in real-time to an observer.

In some other embodiments, there is provided a method and system for identifying the location of an obstruction in a pipeline comprising: altering the pressure of the pipe and holding at the maximum pressure, moving a magnetometer over and along the pipeline, recording the magnetic field measured on the magnetometer as the magnetometer is traversed over the length where the blockage is suspected. Once completed, reducing the pressure and moving the along the same segment, and recording the magnetic field measured on the magnetometer. Comparing the magnetic field strength change/delta at each location between the two passes, either post processing the recording, or in real time while recording the second pass. Wherein when a change/decrease in the magnetic field between the two passes is observed, the method would identify where pressure change was observed and where it was not. In some aspects, the magnetic field change from the pressure change is strong enough, or the sensor sensitive enough, to be measured at the depth of burial of the pipe, and speed of movement.

In some other embodiments, there is provided a method and system for identifying the location of an obstruction in a pipeline comprising: positioning a magnetometer over and along the pipeline at a first location, recording the magnetic field as measured on the magnetometer, altering the pressure of the pipe, determining the time it takes before there is a change in the magnetic field as measured on the magnetometer, moving to another location and positioning the magnetometer over and along the pipeline at the another location, recording the magnetic field as measured on the magnetometer, altering the pressure of the pipe, determining the time it takes before there is a change in the magnetic field as measured on the magnetometer at the another location, wherein the longer the time to increase or decrease the pressure indicates the further distance to obstruction. Therefore, in this embodiment, the pressure is still measured via the magnetic effect, but instead of using the magnitude to confirm which side of the obstruction on the operator is located, this method uses the time for the change in magnitude to calculate the distance to the obstruction. In some aspects measuring the time may be useful when it is suspected that there is a partial blockage wherein pressure does eventually reach the other side of the obstruction, albeit with some delay due to the restriction of flow through/around the blockage. In other aspects, distance to the obstruction. In some aspects measuring may also be useful when it is suspected that the obstruction will/has moved or compressed during the pressure cycling, thereby creating the scenario for the location of the obstruction to change during the pressure cycle.

In some embodiments, standard pipeline metering, volume, and pressure data techniques can be used to assist in determining the various locations to direct testing and to provide an approximate location of the pig and/or obstruction.

In some embodiments, at least one data point produced is stored locally at the location of the magnetometer for subsequent retrieval or is transmitted to a location remote from the location of the magnetometer.

Although aspects of embodiments may be described with reference to flowcharts and/or block diagrams, functions, operations, decisions, etc. of all or a portion of each block, or a combination of blocks, may be combined, separated into separate operations or performed in other orders. All or a portion of each block, or a combination of blocks, may be implemented as computer program instructions (such as software), hardware, firmware or combinations thereof.

Embodiments may be implemented by a processor executing, or controlled by, instructions stored in a memory. The memory may be random access memory (RAM), read-only memory (ROM), flash memory or any other memory, or combination thereof, suitable for storing control software or other instructions and data.

Instructions defining the functions of the present invention may be delivered to a processor in many forms, including, but not limited to, information permanently stored on tangible non-writable storage media (e.g., read-only memory devices within a computer, such as ROM, or devices readable by a computer I/O attachment, such as CD-ROM or DVD disks), information alterably stored on tangible writable storage media (e.g., floppy disks, removable flash memory and hard drives) or information conveyed to a computer through a communication medium, including wired or wireless computer networks.

Example: Use of the XLI PWA to detect magnetic change due to the pressure cycles being applied to the pipe.
1. Position Spectrum XLI PWA sensor on a section of the pipe suspected of having an obstruction. Ideally, the sensor is positioned level and directly over the pipe, orientated axially with the pipe (with X sensor aligned axially).
2. When the pipeline operator is confirmed ready to change the pressure on the pipe, start the survey. Optionally, the pipeline operator is positioned near the pump end where a pressure gauge can be used to verify that there is pressure being applied to that segment of pipe.
3. Confirm GPS fix, and that the GPS data letters are Green indicating filter thresholds are met. If not, wait for GPS fix, or move GPS antenna to get a differential fix meeting thresholds.
4. Advance to the PWA data streaming screen, and zero the XYZ line traces by tapping in the center of the display.
5. Touch on the right side of the PWA data stream screen to bring up the "zoom level" settings, and select the maximum zoom level.
6. The PWA streaming data will update approximately once per second; watch the stream for a minimum of 3 minutes to ensure that there is no interference or drifting of the zeroed levels; the cyan line trace (Z axis) should be on top and covering the X axis (red) and Y axis (Green).
7. When a stable baseline has been confirmed record a stationary data point and enter the pressure observed at the pressuring point on the line in the comment field.
8. Request the pressure cycle to begin and record a second stationary point when the pressure is being changed; note the start of pressure change in the comment field.
9. Have pipeline operator give immediate notification when the maximum or minimum pressure is reached, and record another point, again entering the pressure in the comment field, as well as whether or not visual observation of the pressure change was evident.
10. Allow the sensor to record 3 minutes of data at the final pressure, and then request the pipeline operator to return to the initial pressure.
11. Have pipeline operator give immediate notification when the maximum or minimum pressure is reached, and record another point, again entering the pressure in the comment field, as well as whether or not visual observation of the pressure change was evident.
12. Close the survey run.
13. Optionally, with the XLI PWA sensor in same position, repeat test with pressure applied from opposite direction if possible.
14. Repeat above, and re-test if any movement of the sensor pod, or unexplained changes in the PWA sensor values are observed.

Figure 2:
FIG. 2 is a magnetometer sensor plot over time where there is an obstruction between the location of the sensor plot recording and the pressure source.

FIG. 2 shows a magnetometer sensor plot over time where there is an obstruction between the location of the sensor plot recording and the pressure source.

At time 00:00 the magnetometer test is initiated with no pressure on the pipe ($P_{min}$). The magnetometer records the baseline magnetic field strength on X, Y and Z axis for one minute (until 00:01); with reference to FIG. 2, when the baseline is achieved with the grey line trace (Z axis) is on top and covers the X axis (blue) and Y axis (orange). The baseline magnetic level of the three sensors are shown at a level of 0.

At time 00:01 the pressure in the pipeline begins to increase and no corresponding change is noted on any of the three magnetic sensors for two minutes as the pressure rises to $P_{max}$.

At time 00:03 the pressure reaches $P_{max}$ and is held for one minute (until 00:04). All three magnetic sensors show no change, and remain stable at the baseline magnetic field strength level.

At time 00:04 the pressure is slowly released and decreases for two minutes and again no change is noted on any of the three magnetic sensors; they remain steady at the 0 level initially observed at $P_{min}$.

At time 00:06 the pressure reaches $P_{min}$ and the magnetic sensors again show the previous 0 magnetic field strength observed as the baseline.

Figure 3:
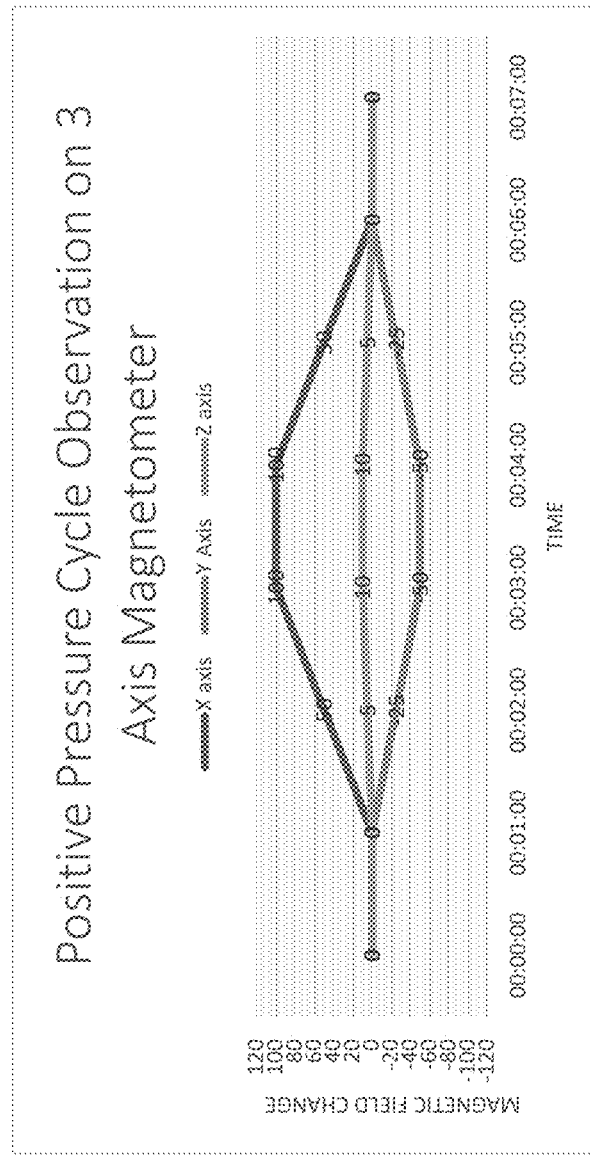
FIG. 3 is a magnetometer sensor plot over time where there is no obstruction between the location of the sensor plot recording and the pressure source from the first end of the pipeline and that the obstruction expected to be between the location of the sensor plot recording and the second end of the pipeline.

FIG. 3 shows a magnetometer sensor plot over time where there is no obstruction between the location of the sensor plot recording and the pressure source from the first end of the pipeline and that the obstruction expected to be between the location of the sensor plot recording and the second end of the pipeline.

At time 00:00 the magnetometer test is initiated with no pressure on the pipe ($P_{min}$). The magnetometer records the baseline magnetic field strength on X, Y and Z axis for one minute (until 00:01); The baseline magnetic level of the three sensors are shown at a level of 0.

At time 00:01 the pressure in the pipeline begins to increase and a corresponding change is noted on all three magnetic sensors for two minutes as the pressure rises to $P_{max}$.

At time 00:03 the pressure reaches $P_{max}$ and is held for one minute (until 00:04). All three magnetic sensors cease to show change, and stabilize at new magnetic field strength level.

At time 00:04 the pressure is slowly released and decreases for two minutes and a change is again noted on all three magnetic sensors as they return to the previous 0 level initially observed at $P_{min}$.

At time 00:06 the pressure reaches $P_{min}$ and the magnetic sensors again show the previous 0 magnetic field strength observed as the baseline.

The embodiments of the present application described above are intended to be examples only. Those of skill in the art may effect alterations, modifications and variations to the particular embodiments without departing from the intended scope of the present application. In particular, features from one or more of the above-described embodiments may be selected to create alternate embodiments comprised of a subcombination of features which may not be explicitly described above. In addition, features from one or more of the above-described embodiments may be selected and combined to create alternate embodiments comprised of a combination of features which may not be explicitly described above. Features suitable for such combinations and subcombinations would be readily apparent to persons skilled in the art upon review of the present application as a whole. Any dimensions provided in the drawings are provided for illustrative purposes only and are not intended to be limiting on the scope of the invention. The subject matter described herein and in the recited claims intends to cover and embrace all suitable changes in technology.

The invention claimed is:
1. A method for identifying the location of an obstruction in a pipeline, the method comprising:
sensing the magnetic field generated by a pipeline at an initial pressure from a first location along the length of the pipeline to obtain a baseline reading;

altering the pressure from a first end of the pipeline until a maximum pressure or minimum pressure is attained;
sensing the magnetic field at the maximum or minimum pressure from the first location to obtain a stress reading; and
identifying the location of the obstruction as
  a) being between a second end of the pipeline and the first location when there is a deviation between the stress reading and the baseline reading at the first location or as
  b) being between the first end of the pipeline and the first location when there is an absence of a deviation between the stress reading and the baseline reading at the first location
    wherein when the location of the obstruction is identified:
    i) as being between the first location and the second end of the pipeline, further comprising:
      sensing the magnetic field generated by the pipeline at an initial pressure from a second location further from the first end of the pipeline than the first location to generate a baseline reading at an initial pressure at the second location;
      altering the pressure from the first end of the pipeline until a maximum pressure or minimum pressure is attained;
      sensing the magnetic field at the maximum or minimum pressure at the second location to generate a stress reading;
      identifying the location of the obstruction as
        a) being between the first location and the second location when there is an absence of deviation between the stress reading and the baseline reading at the second location or as
        b) being further from the first end of the pipeline than the second location when there is a deviation between the stress reading and the baseline reading at the second location; or
    ii) as being between the first end of the pipeline and the first location, further comprising:
      sensing the magnetic field generated by the pipeline at an initial pressure from a third location closer to the first end than the first location along the length of the pipeline to obtain a baseline reading;
      altering the pressure from the first end of the pipeline until a maximum pressure or minimum pressure is attained;
      sensing the magnetic field at the maximum or minimum pressure from the third location to generate a stress reading; and
      identifying the location of the obstruction as
        a) being between the third location and the first location when there is a deviation between the stress reading and the baseline reading at the third location or as
        b) being between the first end of the pipeline and the third location when there is an absence of a deviation between the stress reading and the baseline reading at the second location.

2. The method of claim 1 wherein the sensing comprises producing at least one data point representative of the sensed magnetic field at the initial pressure and at the maximum or minimum pressure and/or visualizing an output representative of the sensed magnetic field at the initial pressure and at the maximum and minimum pressures on a display.

3. The method of claim 2 wherein the at least one data point produced is stored locally for retrieval or is transmitted to a remote location.

4. The method of claim 1, wherein when there is the absence of a deviation between the stress reading and the baseline reading at the first location, further comprising: altering the pressure from the second end of the pipeline opposite the first end until a maximum pressure or minimum pressure is attained; and identifying the location of the obstruction as being
  i) between the first end of the pipeline and the first location when there is a deviation between the stress reading and the baseline reading at the first location only when pressure is changed from the first end of the pipeline;
  ii) between the second end of the pipeline and the first location when there is a deviation between the stress reading and the baseline reading at the first location only when pressure is changed from the second end of the pipeline; or
  iii) at the first location when there is an absence of deviation between the stress reading and the baseline reading at the first location when the pressure is changed from either the first end or the second end of the pipeline.

5. The method of claim 1 wherein the maximum pressure is greater than 0 psi, is greater than maximum design pressure, is greater than about 10% of maximum design pressure, or is greater than about 30% of maximum design pressure.

6. The method of claim 5 wherein the maximum design pressure is the $P_{Barlow}$ pressure.

7. The method of claim 1 wherein the minimum pressure is less than or equal to 0 psi.

8. The method of claim 1 wherein the pipeline is buried under cover and/or the obstruction is a stuck pig.

9. The method of claim 1 further comprising obtaining a GPS position from at least one or more of the locations.

10. The method of claim 1 wherein there are a plurality of spaced apart magnetometers positioned along the length of the pipeline.

11. A system for identifying the location of an obstruction in a pipeline, the system comprising:
  one or more magnetometers configured to sense the magnetic field generated by the pipeline before and during a cycling of pipeline pressure from a first end of the pipeline between an initial pressure and a maximum or minimum pressure when one of the one or more magnetometers is positioned at a first location;
  a processor; and
  a non-transitory computer readable media having instructions stored thereon which when executed cause the processor to:
    obtain a baseline reading of the sensed magnetic field at the initial pressure and a stress reading of the sensed magnetic field at the maximum or minimum pressure; and
    identify the location of the obstruction as
      a) being between a second end of the pipeline and the first location when there is a deviation between the stress reading and the baseline reading at the first location or as
      b) being between the first end of the pipeline and the first location when there is an absence of a deviation between the stress reading and the baseline reading at the first location wherein when the location of the obstruction is identified:
i) as being between the second end of the pipeline and the first location, further comprising a second location further from the first end of the pipeline than the first location to sense the magnetic field generated by the pipeline before and during a cycling of pipeline pressure from the first end of the pipeline between an initial pressure and a maximum or minimum pressure when the one or more magnetometers is positioned at the second location; and instructions when executed to cause the processor to identify the location of the obstruction as
   a) being between the first location and the second location when there is an absence of deviation between the stress reading and the baseline reading at the second location or as
   b) being further from the first end of the pipeline than second location when there is a deviation between the stress reading and the baseline reading at the second location; or
ii) as being between the first end of the pipeline and the first location, further comprising a third location upstream from the first location to sense the magnetic field generated by the pipeline before and during a cycling of pipeline pressure from the first end of the pipeline between an initial pressure and a maximum or minimum pressure when the one or more magnetometers is positioned at the third location; and instructions when executed to cause the processor to identify the location of the obstruction as
   a) being between the third location closer to the first end than the first location when there is a deviation between the stress reading and the baseline reading at the third location or as
   b) being between the first end of the pipeline and the third location when there is an absence of a deviation between the stress reading and the baseline reading at the third location.

12. The system of claim 11 wherein the instructions when executed produce at least one data point representative of the sensed magnetic field at the initial pressure and at the maximum or minimum pressure and/or produce a visual output representative of the sensed magnetic field at the initial pressure and at the maximum and minimum pressures on a display.

13. The system of claim 12 wherein the at least one data point produced is stored locally for retrieval or is transmitted to a remote location.

14. The system of claim 11, wherein when there is the absence of a deviation between the stress reading and the baseline reading at the first location, the pressure from a second end of the pipeline opposite the first end is altered from an initial pressure until a maximum pressure or minimum pressure to identify the location of the obstruction as being
i) between the first end of the pipeline and the first location when there is a deviation between the stress reading and the baseline reading at the first location only when pressure is changed from the first end of the pipeline;
ii) between the second end of the pipeline and the first location when there is a deviation between the stress reading and the baseline reading at the first location only when pressure is changed from the second end of the pipeline; or
iii) at the first location when there is an absence of deviation between the stress reading and the baseline reading at the first location when the pressure is changed from either the first end or the second end of the pipeline.

15. The system of claim 11 wherein the maximum pressure is greater than 0 psi, is greater than maximum design pressure, is greater than about 10% of maximum design pressure, or is greater than about 30% of maximum design pressure.

16. The system of claim 11 wherein maximum design pressure is the $P_{Barlow}$ pressure.

17. The system of claim 11 wherein the minimum pressure is less than or equal to 0 psi.

18. The system of claim 11 wherein the pipeline is buried under cover and/or the obstruction is a stuck pig.

19. The system of claim 11 wherein a geographic position of the at least one or more of the locations is determined using GPS coordinates.

20. The system of claim 11 wherein a plurality of magnetometers are positioned along the length of the pipeline.

21. The system of claim 11 wherein there is one magnetometer which is configured to move from one location to another location.

22. A method for identifying the location of an obstruction in a pipeline comprising:
   positioning a magnetometer near a pipeline at a location;
   recording the magnetic field as measured on the magnetometer;
   altering the pressure of the pipeline from a first end of the pipeline;
   determining the length of time it takes before there is a change in the magnetic field as measured on the magnetometer as result of the change in pressure;
   moving to another location and positioning the magnetometer over the pipeline at the another location;
   recording the magnetic field as measured on the magnetometer;
   altering the pressure of the pipe of the pipeline from the first end;
   determining the length of time it takes before there is a change in the magnetic field as measured on the magnetometer at the another location as result of the change in pressure; and
   identifying the distance from an obstruction from the determined length of times, wherein the longer the time required to increase or decrease the pressure indicates a further distance from the obstruction.

* * * * *